United States Patent
Potvin

(10) Patent No.: US 8,543,870 B2
(45) Date of Patent: Sep. 24, 2013

(54) CIRCUIT FOR DETECTING AND RECORDING CHIP FAILS AND THE METHOD THEREOF

(75) Inventor: Stephen Potvin, Winooski, VT (US)

(73) Assignee: Nanya Technology Corporation, Kueishan, Tao-Yuan Hsien (TW)

( * ) Notice: Subject to any disclaimer, the term of this patent is extended or adjusted under 35 U.S.C. 154(b) by 403 days.

(21) Appl. No.: 13/026,684

(22) Filed: Feb. 14, 2011

(65) Prior Publication Data

US 2012/0210170 A1 Aug. 16, 2012

(51) Int. Cl.
*G06F 11/00* (2006.01)
(52) U.S. Cl.
USPC .......................................................... 714/48
(58) Field of Classification Search
USPC .................... 714/25–32, 37, 38.1, 39, 44–46, 714/47.1, 48–50, 57
See application file for complete search history.

(56) References Cited

U.S. PATENT DOCUMENTS

| | | | | |
|---|---|---|---|---|
| 4,438,494 A | * | 3/1984 | Budde et al. | 714/2 |
| 4,633,431 A | * | 12/1986 | Bar | 710/100 |
| 5,974,351 A | * | 10/1999 | Croft et al. | 701/48 |
| 6,965,307 B2 | * | 11/2005 | Pearson et al. | 340/468 |
| 2004/0263340 A1 | * | 12/2004 | Pearson et al. | 340/641 |
| 2008/0148827 A1 | * | 6/2008 | Keski-Hynnila et al. | 73/114.31 |
| 2012/0011403 A1 | * | 1/2012 | Bock et al. | 714/30 |

\* cited by examiner

*Primary Examiner* — Nadeem Iqbal

(74) *Attorney, Agent, or Firm* — Novak Druce Connolly Bove + Quigg LLP

(57) ABSTRACT

A circuit for detecting and recording chip fails according to one embodiment of the present invention comprises a common error bus, a plurality of fail detector modules and a control center. Each of the plurality of fail detector modules is configured to receive at least a data signal to determine an occurrence of a chip fail and to correspondingly broadcast a fail code on the common error bus when the common error bus is not busy. The control center is configured to record a fail code from the common error bus and to report the recorded fail code when required.

6 Claims, 6 Drawing Sheets

CIRCUIT FOR DETECTING AND RECORDING CHIP FAILS AND THE METHOD THEREOF

BACKGROUND OF THE INVENTION

1. Field of the Invention

The present invention relates to a circuit design, and more particularly, to a circuit design for detecting and recording chip fails.

2. Description of the Related Art

In circuit design, it is not uncommon for the chip to fail during the test stage. Therefore, debugging, i.e. locating the problem that causes the chip to fail, is extremely important, and may even comprise a majority of the time needed to produce the product. Debugging fails on chips can be very costly and time consuming, especially if there are no probe pads available when they are needed in the debugging process. Therefore, there is a need to design a circuit and method to detect and record chip fails.

SUMMARY OF THE INVENTION

The circuit for detecting and recording chip fails according to one embodiment of the present invention comprises a common error bus, a plurality of fail detector modules and a control center. Each of the plurality of fail detector modules is configured to receive at least a data signal to determine an occurrence of a chip fail and to correspondingly broadcast a fail code on the common error bus when the common error bus is not busy. The control center is configured to record a fail code from the common error bus and to report the recorded fail code when required.

The method for detecting and recording chip fails according to one embodiment of the present invention comprises the steps of: receiving at least a data signal to determine an occurrence of a chip fail; broadcasting a fail code of the chip fail on a common error bus when the common error bus is not busy; collecting the fail code from the common error bus and storing the chip fail into a memory; and retrieving and reporting the fail code when requested.

The foregoing has outlined rather broadly the features and technical advantages of the present invention in order that the detailed description of the invention that follows may be better understood. Additional features and advantages of the invention will be described hereinafter, and form the subject of the claims of the invention. It should be appreciated by those skilled in the art that the conception and specific embodiment disclosed may be readily utilized as a basis for modifying or designing other structures or processes for carrying out the same purposes as those of the present invention. It should also be realized by those skilled in the art that such equivalent constructions do not depart from the spirit and scope of the invention as set forth in the appended claims.

BRIEF DESCRIPTION OF THE DRAWINGS

The objectives and advantages of the present invention will become apparent upon reading the following description and upon referring to the accompanying drawings of which.

DETAILED DESCRIPTION OF THE INVENTION

Figure 1:
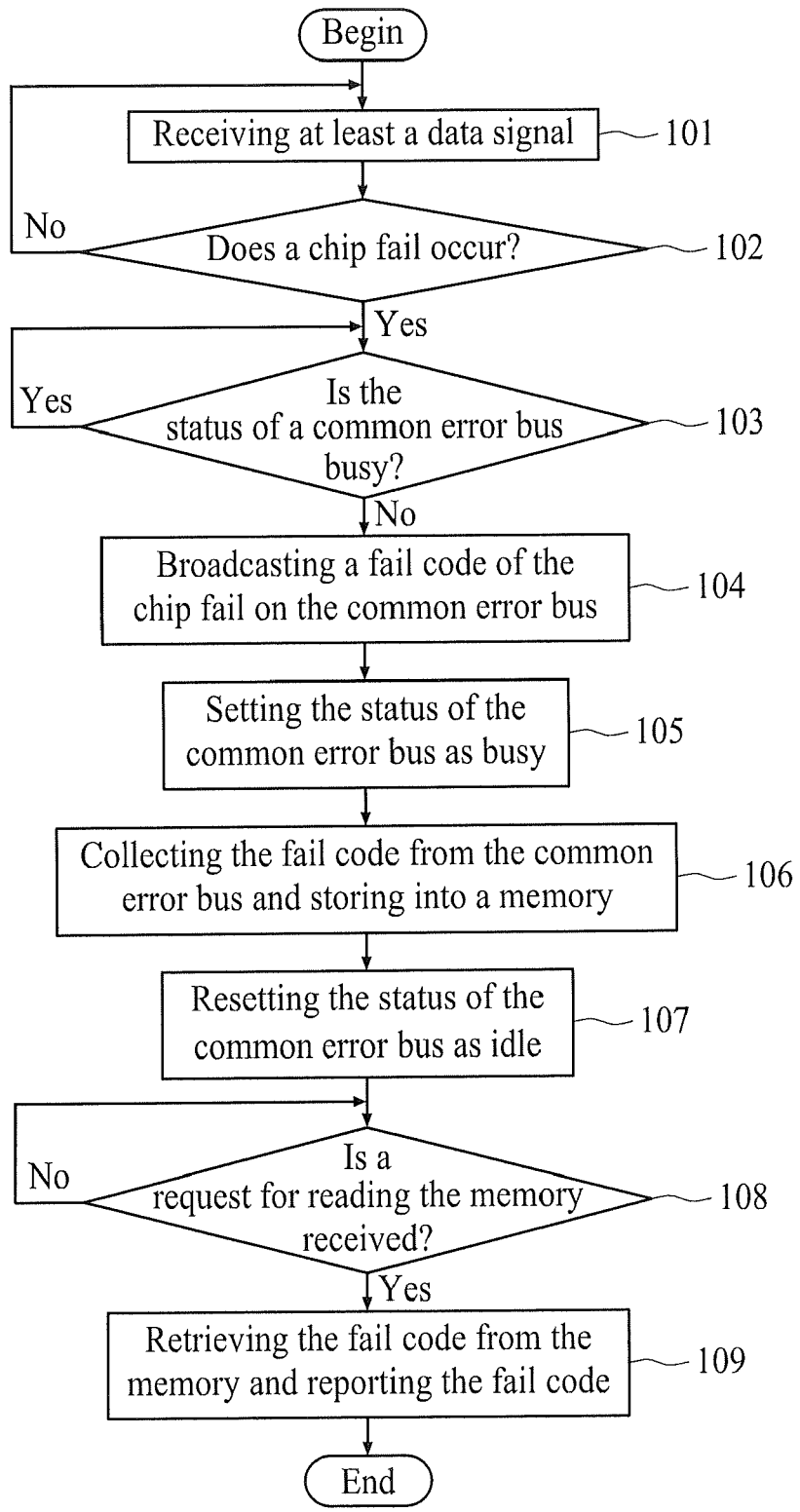
FIG. 1 shows a flowchart of the method for detecting and recording chip fails according to an embodiment of the present invention.

FIG. 1 shows a flowchart of the method for detecting and recording chip fails according to an embodiment of the present invention. In step 101, at least a data signal is received, and step 102 is executed. In step 102, whether a chip fail occurs is determined according to the at least one received data signal. If a chip fail occurs, step 103 is executed; otherwise, step 101 is executed. In step 103, whether the status of a common error bus is busy is determined. If the status of the common error bus is busy, step 103 is executed; otherwise, step 104 is executed. In step 104, a fail code of the chip fail is broadcasted on the common error bus, and step 105 is executed. In step 105, the status of the common error bus is set as busy, and step 106 is executed. In step 106, the fail code is collected from the common error bus and is stored into a memory, and step 107 is executed. In step 107, the status of the common error bus is reset as idle, and step 108 is executed. In step 108, whether a request for reading the memory is received is determined. If a request for reading the memory is received, step 109 is executed; otherwise, step 108 is executed. In step 109, the fail code is retrieved from the memory and is reported, and the present method is finished.

In some embodiments of the present invention, in step 102, the occurrence of a chip fail is determined according to two received data signals. In some embodiments of the present invention, in step 104, every bit of the fail code is broadcasted in parallel; while in other embodiments of the present invention, in step 104, each bit of the fail code is broadcasted serially. In some embodiments of the present invention, in step 104, the broadcasting of the fail code on the common error bus is synchronous with a bus clock signal.

Figure 2:
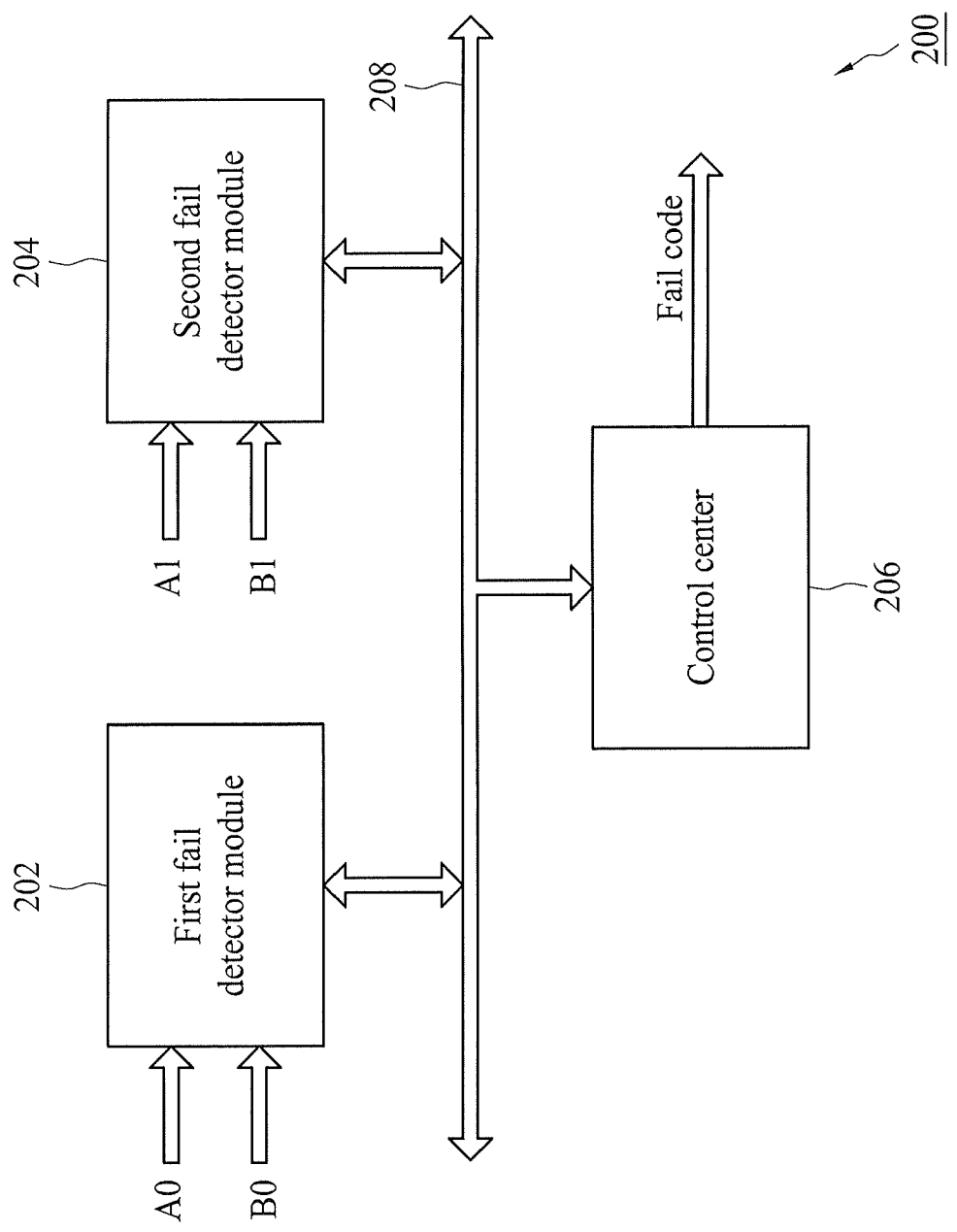
FIG. 2 shows the block diagram of a circuit for detecting and recording chip fails according to an embodiment of the present invention.

FIG. 2 shows the block diagram of a circuit for detecting and recording chip fails according to an embodiment of the present invention. The circuit 200 shown in FIG. 2 can be used to implement the method shown in FIG. 1. As shown in FIG. 2, the circuit 200 comprises a first fail detector module 202, a second fail detector module 204, a control center 206 and a common error bus 208. The first fail detector module 202 and the second fail detector module 204 are both configured to individually receive two data signals to determine an occurrence of a chip fail and to correspondingly broadcast a fail code on the common error bus 208 when the common error bus 208 is not busy. As can be seen from FIG. 2, the first fail detector module 202 received the data signals of A0 and B0, while the second fail detector module 204 received the data signals of A1 and B1, wherein the data signals A0, B0, A1 and B1 can be internal signals from a chip. The control center 206 is configured to record a fail code from the common error bus 208 and to report the recorded fail code when required.

When a chip fail occurs, which is reflected by the combination of the data signals A0 and B0 or A1 and B1, and the common error bus 208 is not busy, either the first fail detector module 202 or the second fail detector module 204 will broadcast a fail code on the common error bus 208. Accordingly, the control center 206 collects the fail code and reports the fail code when requested. According to the reported fail code, the source or the cause of the chip fail can be determined.

Figure 3:
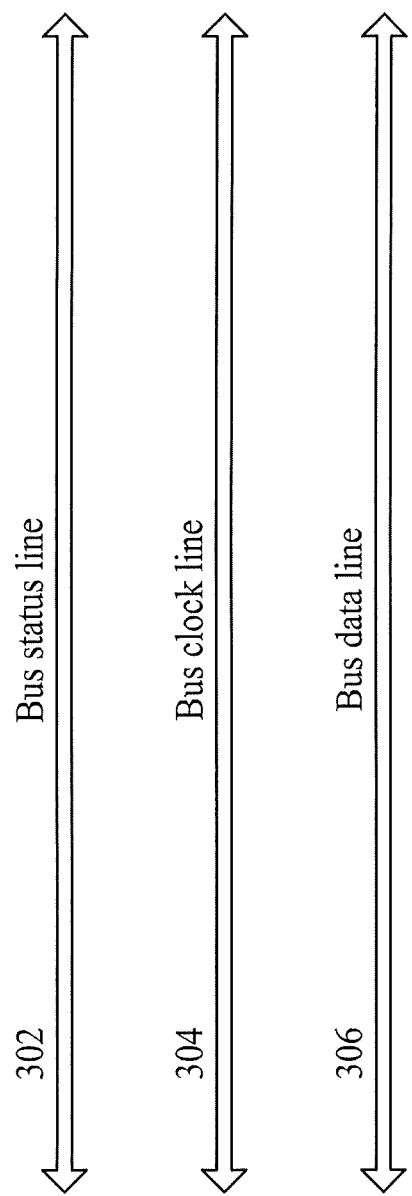
FIG. 3 shows the block diagram of a common error bus according to an embodiment of the present invention.

FIG. 3 shows a block diagram of the common error bus 208 shown in FIG. 2. As shown in FIG. 3, the common error bus 208 comprises three data lines: a bus status line 302, a bus clock line 304 and a bus data line 306. The bus status line 302 is used to carry a bus state signal indicating either an idle state or a busy state of the common error bus 208. The bus clock line 304 is used to carry a bus clock signal. The bus data line 306 is used to carry a fail code from either the first fail detector module 202 or the second fail detector module 204 to the control center 206.

Figure 4:
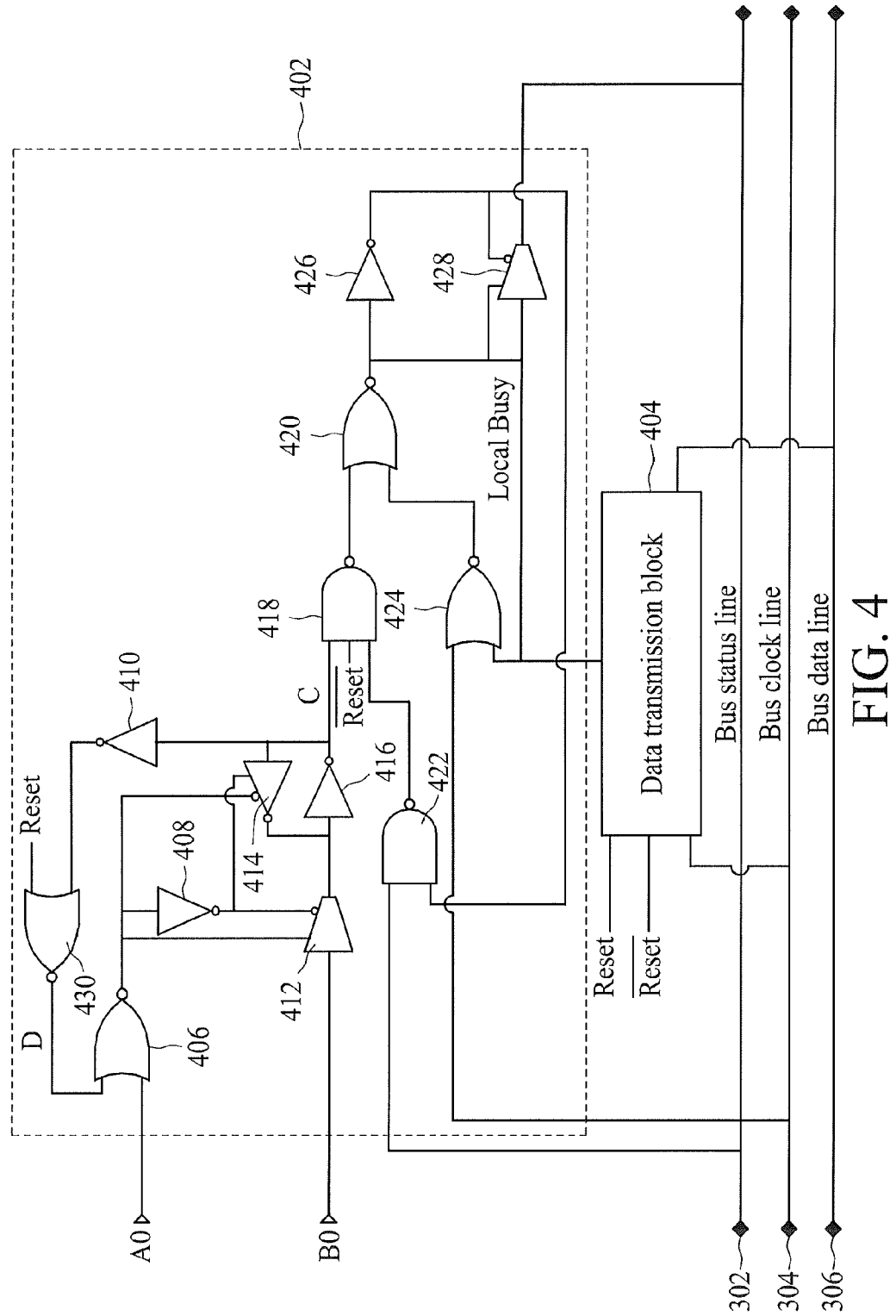
FIG. 4 shows the block diagram of a fail detector module according to an embodiment of the present invention.

FIG. 4 shows a block diagram of the first fail detector module 202 shown in FIG. 2. The second fail detector module 204 has a structure similar to that of the first fail detector module 202. As shown in FIG. 4, the first fail detector module 202 comprises a combinational logic 402 and a data transmission block 404. The combinational logic 402, comprising gate logics of 406 to 430, includes a plurality of input ports to receive the data signals A0 and B0, the bus state signal, the bus clock signal and a reset signal and a plurality of output ports to provide a local busy signal and the bus state signal, and is configured to provide the bus state signal indicating the busy state of the common error bus 208 and to instruct the data transmission block 404 to broadcast a fail code when the combinational logic 402 determines an occurrence of a chip fail according to the data signals A0 and B0, and to provide the bus state signal indicating the idle state of the common error bus 208 when the combinational logic 402 receives the reset signal. The data transmission block 404 includes a plurality of input ports to receive the bus clock signal, the reset signal and the local busy signal and an output port to broadcast a fail code on the bus data line 306 of the common error bus 208, and is configured to broadcast a fail code on the bus data line 306 when receiving the local busy signal and to stop broadcasting when receiving the reset signal.

In some embodiments of the present invention, the data transmission block 404 broadcasts every bit of the fail code in parallel, while in other embodiments of the present invention, the data transmission block 404 broadcasts each bit of the fail code serially. The first fail detector module 202 and the second fail detector module 204 correspond to different fail codes such that when a fail code is reported, the source of the fail code can be determined.

Figure 5:
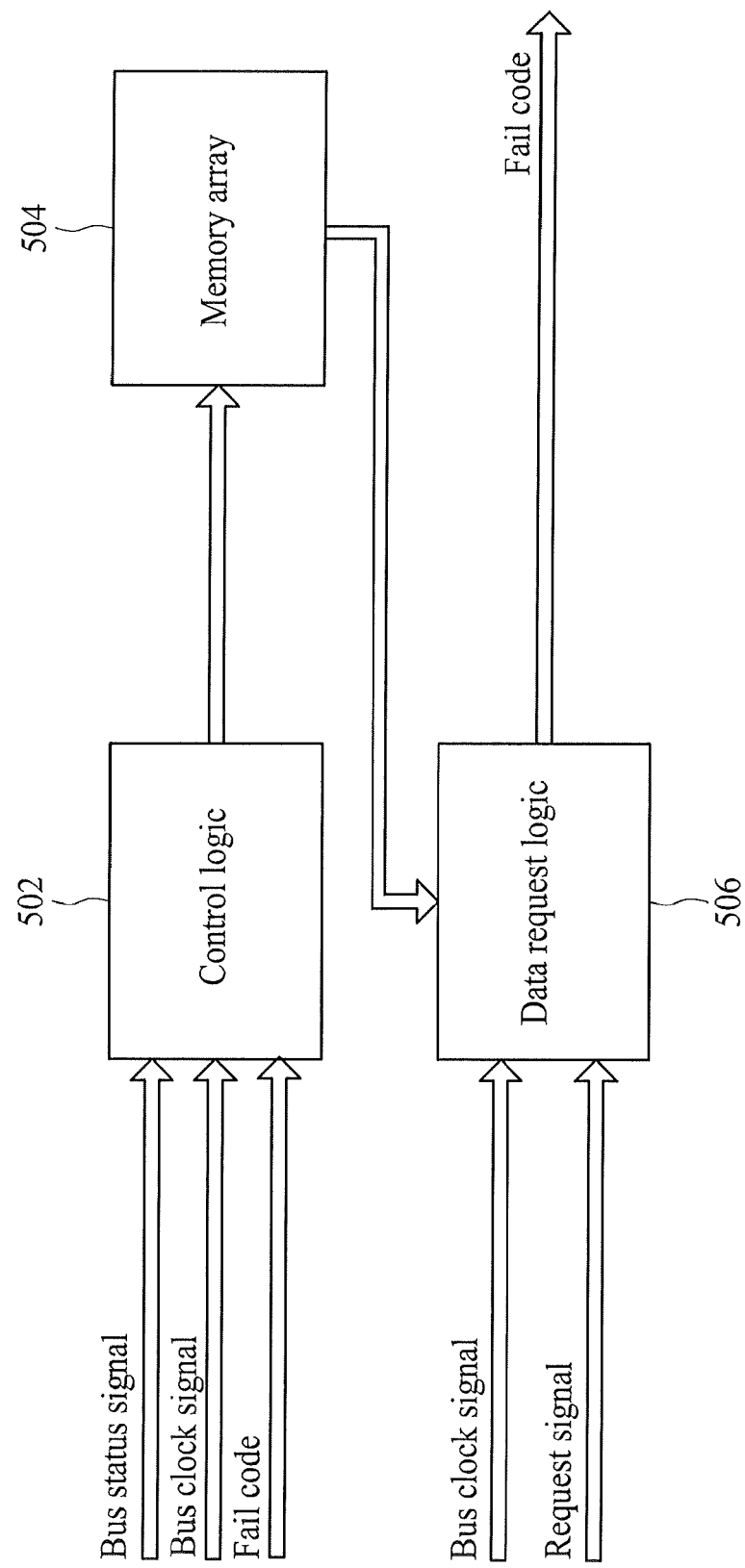
FIG. 5 shows the block diagram of a control center according to an embodiment of the present invention.

FIG. 5 shows a block diagram of the control center 206 shown in FIG. 2. As shown in FIG. 5, the control center 206 comprises a control logic 502, a memory array 504 and a data request logic 506. The control logic 502 includes a plurality of input ports to receive the bus state signal, the bus clock signal and a fail code from the common error bus 208 and an output port to store the fail code to the memory array 504 through a write port of the memory array 504, and is configured to collect a fail code from the common error bus 208 and store the collected fail code to the memory array 504 when the state of the common error bus 208 indicated by the bus state signal is busy. The data request logic 506 includes a plurality of input ports to receive the bus clock signal and a request signal and an output port to report a fail code retrieved from the memory array 504 through a read port of the memory array 504, and is configured to read a fail code from the memory array 504 and report the read fail code when receiving the request signal.

Figure 6:
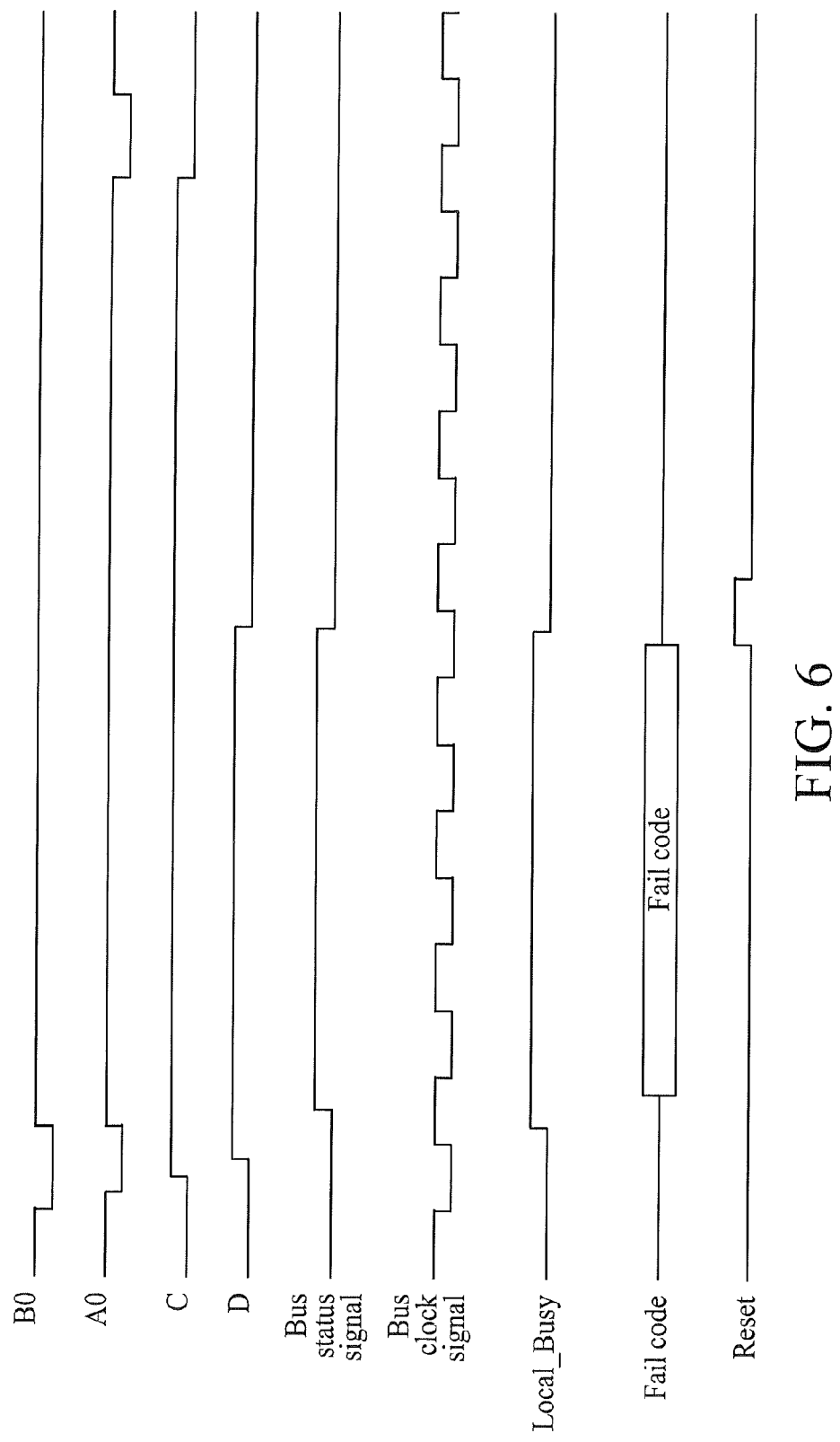
FIG. 6 shows a waveform of different signal lines when applying the method and circuit for detecting and recording chip fails provided by an embodiment of the present invention.

FIG. 6 shows a waveform of different signal lines in the first fail detector module 202. As shown in FIG. 6, when the combination of the data signal A0 and B0 indicates a chip fail, the output local busy signal of the combinational logic 402 is activated. Accordingly, the combinational logic 402 outputs the bus state signal with logic high indicating a busy state of the common error bus 208, and the data transmission block 404 broadcasts a fail code on the common error bus 208. In addition, when a reset signal is received, the broadcasting of the fail code stops, and the status of the common error bus 208 is reset.

In conclusion, the method and circuit for detecting and recording chip fails according to embodiments of the present invention are most applicable for, but not limited to, use with systems to record internal fails or conditions. This is done by first monitoring for internal fails and when an internal fail is detected, sending a fail code to a common error bus. The fail code propagates to a control center where it is recorded. The fail code can then be read to determine where and what type of fail occurred.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A circuit for detecting and recording chip fails, comprising:
   a common error bus, wherein the common error bus comprises:
      a bus status line, carrying a bus state signal indicating either an idle state or a busy state of the common error bus;
      a bus clock line, carrying a bus clock signal; and
      a bus data line, carrying a fail code from one of the plurality of fail detector modules to the control center;
   a plurality of fail detector modules, each of which is configured to receive at least a data signal to determine an occurrence of a chip fail and to correspondingly broadcast a fail code on the common error bus when the common error bus is not busy, wherein each of the plurality of fail detector modules comprises:
      a combinational logic, including a plurality of input ports to receive the at least a data signal, the bus state signal, the bus clock signal and a reset signal and a plurality of output ports to provide a local busy signal and the bus state signal; and
      a data transmission block, including a plurality of input ports to receive the bus clock signal, the reset signal and the local busy signal and an output port to broadcast a fail code on the bus data line of the common error bus;
   wherein the combinational logic is configured to provide the bus state signal indicating the busy state of the common error bus and to instruct the data transmission block to broadcast a fail code when the combinational logic determines an occurrence of a chip fail according to the at least a data signal, and to provide the bus state signal indicating the idle state of the common error bus when the combinational logic receives the reset signal;

wherein the data transmission block is configured to broadcast a fail code on the bus data line when receiving the local busy signal and to stop broadcasting when receiving the reset signal; and a control center, configured to record a fail code from the common error bus and to report the recorded fail code when required.

2. The circuit of claim 1, wherein the data transmission block broadcasts every bit of the fail code in parallel.

3. The circuit of claim 1, wherein the data transmission block broadcasts each bit of the fail code serially.

4. The circuit of claim 1, wherein each of the plurality of fail detector modules is configured to receive two data signals to determine an occurrence of a chip fail.

5. The circuit of claim 1, wherein each of the plurality of fail detector modules corresponds to a unique fail code.

6. A circuit for detecting and recording chip fails, comprising:

a common error bus, wherein the common error bus comprises:

a bus status line, carrying a bus state signal indicating either an idle state or a busy state of the common error bus;

a bus clock line, carrying a bus clock signal; and a bus data line, carrying a fail code from one of the plurality of fail detector modules to the control center;

a plurality of fail detector modules, each of which is configured to receive at least a data signal to determine an occurrence of a chip fail and to correspondingly broadcast a fail code on the common error bus when the common error bus is not busy; and a control center, configured to record a fail code from the common error bus and to report the recorded fail code when required, wherein the control center comprises:

a memory array, including a read port and a write port;

a control logic, including a plurality of input ports to receive the bus state signal, the bus clock signal and a fail code from the common error bus and an output port to store the fail code to the memory array through the write port; and a data request logic, including a plurality of input ports to receive the bus clock signal and a read request signal and an output port to report a fail code retrieved from the memory array through the read port;

wherein the control logic is configured to collect a fail code from the common error bus and store the collected fail code to the memory array when the state of the common error bus indicated by the bus state signal is busy;

wherein the data request logic is configured to read a fail code from the memory array and report the read fail code when the data request logic receives the read request signal.

* * * * *